US007387963B2

(12) United States Patent
Rupp et al.

(10) Patent No.: US 7,387,963 B2
(45) Date of Patent: Jun. 17, 2008

(54) SEMICONDUCTOR WAFER AND PROCESS FOR PRODUCING A SEMICONDUCTOR WAFER

(75) Inventors: Rudolf Rupp, Julbach (DE); Werner Aigner, Pfarrkirchen (DE); Friedrich Passek, Adlkofen (DE)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 11/487,653

(22) Filed: Jul. 17, 2006

(65) Prior Publication Data

US 2007/0017900 A1 Jan. 25, 2007

(30) Foreign Application Priority Data

Jul. 21, 2005 (DE) ...................... 10 2005 034 120

(51) Int. Cl.
*H01L 21/302* (2006.01)

(52) U.S. Cl. ...................... 438/689; 438/626; 438/631; 438/691; 438/706; 216/90; 216/91; 216/89; 451/41

(58) Field of Classification Search ................ 438/689; 216/91; 451/41
See application file for complete search history.

(56) References Cited

U.S. PATENT DOCUMENTS

| | | | | |
|---|---|---|---|---|
| 5,542,874 | A * | 8/1996 | Chikaki | 451/158 |
| 5,989,105 | A | 11/1999 | Kawakawaguchi et al. | |
| 6,458,688 | B1 * | 10/2002 | Wenski et al. | 438/626 |
| 6,566,267 | B1 * | 5/2003 | Wenski | 438/692 |
| 2001/0014570 | A1 * | 8/2001 | Wenski et al. | 451/41 |
| 2006/0072105 | A1 | 4/2006 | Wagner | |

FOREIGN PATENT DOCUMENTS

| | | | |
|---|---|---|---|
| DE | 199 05 737 | A1 | 8/2000 |
| DE | 100 12 840 | A1 | 4/2001 |
| DE | 199 49 578 | A1 | 5/2001 |
| DE | 199 56 250 | C1 | 5/2001 |
| DE | 100 04 578 | C1 | 7/2001 |
| DE | 102 12 657 | A1 | 10/2002 |
| DE | 103 52 936 | A1 | 12/2004 |
| EP | 1235268 | A4 | 8/2002 |
| EP | 1 348 947 | A1 | 10/2003 |
| KR | 20010049553 | A | 6/2001 |
| KR | 20020039348 | | 5/2002 |

OTHER PUBLICATIONS

English Derwent Abstract AN 2003-020857 corresponding to DE 102 12 657 A1.
English Derwent Abstract AN 2001-301080 corresponding to DE 100 12 840 A1.
English Derwent Abstract AN 2001-399253 corresponding to DE 199 49 578 A1.
Abstract of the Korean Intellectual Patent Office, Pub. No. 2001-0049553, Applicant: Speedfam Ipec Co. Ltd.
Abstract of Korean Pub. No. KR20040005058.

* cited by examiner

*Primary Examiner*—Binh X Tran
*Assistant Examiner*—Maki Angadi
(74) *Attorney, Agent, or Firm*—Brooks Kushman P.C.

(57) ABSTRACT

A semiconductor wafer has an edge region with no defects larger than or equal to 0.3 μm. The wafers are produced by a process, comprising (a) providing a semiconductor wafer having a rounded and etched edge; (b) polishing the edge of the semiconductor wafer, in which step the semiconductor wafer, which is held on a centrally rotating chuck and projects beyond the chuck and at least one polishing drum which is inclined by a specific angle with respect to the chuck, rotates centrally and is covered with a polishing cloth, are moved toward one another and pressed onto one another under a specific contact pressure with a polishing abrasive being supplied continuously; (c) cleaning the semiconductor wafer; (d) inspecting an edge region of the semiconductor wafer using an inspection unit; and (e) further processing the semiconductor wafer.

10 Claims, No Drawings

SEMICONDUCTOR WAFER AND PROCESS FOR PRODUCING A SEMICONDUCTOR WAFER

BACKGROUND OF THE INVENTION

1. Field of the Invention

The invention relates to a semiconductor wafer having improved edge region quality, and to a process for producing such a semiconductor wafer.

2. Background Art

The quality demands imposed on the edge of a semiconductor wafer are ever increasing, in particular for large semiconductor wafer diameters (diameter≧300 mm). In particular, the edge of the semiconductor wafer should, as far as possible, be free of contamination and have a low roughness. Moreover, it should be able to withstand high mechanical stresses during handling.

The untreated edge of a semiconductor wafer which has been processed from a single crystal has a relatively rough and uneven surface. Spalling often occurs under mechanical loading, and consequently the wafer represents a source of contaminating particles. It is therefore customary to regrind the edge in order thereby to eliminate spalling and damage in the crystal and to provide it with a specific profile.

Suitable grinding equipment is known from the prior art. It is customary for the semiconductor wafer to be fixed on a rotating table and for its edge to be moved against the rotating working surface of a machining tool. The machining tools used are generally in the form of disks which are secured to a spindle and have circumferential surfaces serving as working surfaces for machining the edge of the semiconductor wafer. The material-removing abrasive grain is usually securely anchored in the working surfaces of the machining tools. These machining tools are suitable for providing the semiconductor wafer with a rounded edge. It is usual for a certain minimum roughness to remain on the edge surface after the edge rounding.

In a subsequent machining step, the edge of the semiconductor wafer, which has been ground and treated with an etching medium, is usually polished. For example, the edge of a centrally rotating semiconductor wafer may be pressed against a centrally rotating polishing drum with a defined force (contact pressure). U.S. Pat. No. 5,989,105 discloses an edge polishing process of this type, in which the polishing drum consists of an aluminum alloy covered with a polishing cloth. The semiconductor wafer is usually fixed on a flat wafer holder, known as a chuck. The edge of the semiconductor wafer projects beyond the chuck so that it is freely accessible to the polishing drum.

For process monitoring, after edge polishing, it is customary to perform a visual check of the edges of representative samples of the semiconductor wafers under a microscope. This visual check is for particles, roughness and defects on the edge of the semiconductor wafer. In particular, the edge of the semiconductor wafer is examined for light reflections which are caused by any unevenness. However, such visual checks are unreliable and do not allow a uniform edge quality to be ensured for all semiconductor wafers processed. Furthermore, the visual check is unsuitable for completely and reliably detecting small defects in the edge region of a semiconductor wafer so as to draw conclusions as to possible defective processing procedures.

Furthermore, there are available inspection appliances which only allow inspection of the semiconductor wafer as far as the wafer edge to a peripheral exclusion zone of 3 mm. Most known inspection appliances cannot be used to examine the entire edge region, i.e. both the edge of the semiconductor wafer and the peripheral exclusion zone. By way of example, EP 1348947 A1 discloses an inspection apparatus which can be used to inspect the edge of the semiconductor wafer but not the entire edge region, while DE 10352936 A1 describes an inspection apparatus which allows automatic detection of defects above a certain size in the entire edge region including the peripheral exclusion zone of the semiconductor wafer.

SUMMARY OF THE INVENTION

It was an object of the invention to provide a semiconductor wafer with an improved edge quality and to provide a process for producing this semiconductor wafer. These and other objects are achieved by a semiconductor wafer comprising an edge region which does not have any defects larger than or equal to 0.3 μm.

DETAILED DESCRIPTION OF THE PREFERRED EMBODIMENT(S)

In the present invention, the edge region comprises at least an edge of the semiconductor wafer. It is preferable for the edge region of the semiconductor wafer to comprise the edge of the semiconductor wafer and a peripheral region of 3 mm on the front and back surfaces of the semiconductor wafer. It is further preferable for the edge region of the semiconductor wafer to comprise all the inclined and rounded surfaces of the edge of the semiconductor wafer.

The defects comprise particles, spalling chips, cracks, scratches, spots, contamination, and stacking faults on the edge region of the semiconductor wafer. It is preferable for the edge of the semiconductor wafer to be polished.

The semiconductor wafer is preferably a monocrystalline silicon wafer, a polished silicon wafer, a silicon wafer with an epitaxial coating, a silicon wafer which has been heat-treated, for example in an argon atmosphere, a wafer with a strained silicon layer, an SOI (silicon on insulator) wafer or an sSOI (strained silicon on insulator) wafer.

The process of the invention comprises the following process sequence: (a) providing a semiconductor wafer having a rounded and etched edge; (b) polishing the edge of the semiconductor wafer, in which step the semiconductor wafer, which is held on a centrally rotating chuck, the edge of which projects beyond the chuck, and at least one polishing drum which is inclined at a specific angle with respect to the chuck, which rotates centrally and is covered with a polishing cloth, are moved toward one another and pressed onto one another under a specific contact pressure with a polishing abrasive being supplied continuously, the polishing drum and semiconductor wafer being moved away from one another after a predetermined number of revolutions of the semiconductor wafer; (c) cleaning the semiconductor wafer; (d) inspecting an edge region of the semiconductor wafer using an inspection unit; and (e) further processing the semiconductor wafer; wherein the inspection of the edge region of the semiconductor wafer as described in step (d) automatically detects and classifies all the defects above a size of 0.3 μm in the edge region, and wherein, if defects are detected during the inspection, the semiconductor wafer is reprocessed as described in steps (b) to (d) and is then processed further as described in step (e), the edge polishing as described in step (b) being carried out with polishing parameters which have been optimized on the basis of the classification of the defects, or otherwise the semiconductor wafer is sorted out and removed if reprocessing is not possible on account of the defects which have been detected.

In the process according to the invention, first of all a semiconductor wafer having a rounded and etched edge is provided. For this purpose, it is preferable for a semiconductor wafer, in accordance with the prior art, to be taken from a single crystal, for its edge to be rounded and for its front and back surfaces to be leveled by means of grinding and/or lapping processes and subjected to a wet-chemical etching treatment. The rounded and etched edge of the semiconductor wafer is then polished as described in step (b).

Commercially available automated edge-polishing units are available for this purpose. The semiconductor wafer is fixed on a centrally rotating chuck, with the semiconductor wafer projecting beyond the chuck. A centrally rotating polishing drum, which is covered with a polishing cloth and inclined at an angle with respect to the chuck, and the chuck with the semiconductor wafer, are moved toward one another and pressed onto one another under a certain contact pressure while a polishing abrasive is continuously supplied.

Then, the semiconductor wafer is subjected to cleaning as described in step (c). The cleaning can be carried out either as a batch process with simultaneous cleaning of a multiplicity of semiconductor wafers being bathed or using spraying processes or, alternatively, as a single wafer process.

In the context of the invention, it is preferable to carry out bath cleaning with simultaneous cleaning of a multiplicity of semiconductor wafers, for example all the wafers from an edge polishing operation, for example in the sequence cleaning with aqueous hydrochloric acid (HF)—rinsing with ultra pure water—cleaning with $TMAH/H_2O_2$ (tetramethylammonium hydroxide/hydrogen peroxide)—rinsing with ultra pure water. Then, the semiconductor wafer is dried. It is customary for the drying to be carried out using commercially available appliances which operate according to the centrifugal drying, hot water, or HF/ozone principles. The edge-polished semiconductor wafers obtained after the cleaning and drying step are dry and hydrophilic.

The bath cleaning is followed, in accordance with step (d), by an inspection of the edge region of the semiconductor wafer. An inspection unit according to the prior art, preferably corresponding to the apparatus as described in DE 10352936 A1, is used for this purpose. The mode of operation of an inspection unit of this type is based on the detection of light in the dark field, which is scattered at what are known as light point defects (LPDs), i.e. for example crystal defects, damage, scratches, impurities or particles. In the process, each defect is assigned a size equivalent to its light scattering properties, known as the "latex sphere equivalent" (LSE).

As indicated previously, the edge region comprises at least the edge of the semiconductor wafer, but it is preferable for the edge region to include all the inclined and rounded surfaces of the edge of the wafer, and preferably also a peripheral region of 3 mm on the front and back surfaces of the semiconductor wafer.

The inspection of the edge region of the semiconductor wafer detects and classifies defects above a size of 0.3 μm. Semiconductor wafers which have defects larger than this size are reprocessed by means of another polishing of the edge in accordance with step (b), but with optimized polishing parameters, or, if reworking is not possible, are sorted out and removed. According to the invention, the optimization of the polishing parameters is carried out on the basis of the classification of the defects detected during the inspection.

On account of the fact that only the semiconductor wafers which satisfy the demands imposed on the edge quality are processed further in accordance with step (e), it is possible to ensure a uniform quality of the edge region of the semiconductor wafers, which is highly advantageous for the subsequent further processing, which in some cases also entails high mechanical stresses at the edge region of the semiconductor wafer.

The further processing in accordance with step (e) may, for example, comprise polishing of the semiconductor wafer (double side polishing, chemical mechanical polishing), back surface sealing, depositing an epitaxial layer on the front surface of the semiconductor wafer or heat treating the semiconductor wafer under a hydrogen or argon atmosphere.

According to the invention, therefore, if defects are detected in the edge region of a semiconductor wafer during edge polishing and cleaning, reprocessing is carried out by edge polishing using optimized polishing parameters. The text which follows provides a description of optimized and preferred ranges of values for polishing parameters based on defects or defect classifications which typically occur; according to the invention, these polishing parameters are optimized further after the inspection of the edge region and the defect classification as part of reprocessing of the semiconductor wafer during edge polishing.

During the edge polishing, the chuck with the semiconductor wafer held on it is rotated centrally. It is preferable for one revolution of the chuck to last 50 to 150 s (revolution time).

A polishing drum, which is covered with a polishing cloth and is preferably rotated centrally at a rotational speed of 500 to 1000 $min^{-1}$, and the chuck are moved toward one another, with the polishing drum set obliquely at a setting angle with respect to the semiconductor wafer and the semiconductor wafer being fixed on the chuck in such a way that it projects slightly beyond the chuck and is therefore accessible to the polishing drum. The setting angle is preferably 30 to 50°.

The semiconductor wafer and polishing drum are pressed onto one another under a certain contact pressure and with a polishing abrasive being supplied continuously, preferably at a polishing abrasive flow rate of 0.15 to 0.40 liter/min, it being possible for the contact pressure to be set by means of weights attached to the rolls. It is preferable to select a contact pressure of 2 to 4 kg.

It is preferable for the semiconductor wafer and polishing drum to be moved away from one another after 2 to 8 revolutions of the semiconductor wafer or the chuck holding the semiconductor wafer.

EXAMPLE

During the inspection of a semiconductor wafer, defects of a size of 0.3 μm or above were detected in the edge region. Therefore, the semiconductor wafer was reprocessed by means of an edge polishing, with the following optimized polishing parameters being set: a chuck revolution time of 85 s (per revolution), a polishing drum rotational speed of 800 min−1, a contact pressure of 3 kg, a setting angle of 40°, a polishing abrasive flow rate of 0.30 liter/min for 4 complete revolutions of the semiconductor wafer (or chuck). These polishing parameters were set on the basis of the classification of the detected defects. After bath cleaning, it was not possible, on further inspection of the edge region, to detect any defects above a size of 0.3 μm.

The edge polishing is the most important process step influencing the edge of the semiconductor wafer, since in a process sequence for producing semiconductor wafers it is usually the final process step involving direct machining of the edge of the semiconductor wafer. Therefore, a check of the edge region of the semiconductor wafer and a process control are particularly important after this process step. However, it is preferable for the edge region of the semiconductor wafer also to be checked, and the corresponding process step controlled, after other process steps which influence the edge region of a semiconductor wafer.

Therefore, in a process for producing a semiconductor wafer which comprises a plurality of process steps influencing an edge region of the semiconductor wafer, it is preferable that after each of these process steps, the edge region of the semiconductor wafer is checked using an inspection unit, the edge region of the semiconductor wafer comprising its edge and peripheral regions of its front and back surfaces at a distance of 3 mm from the edge, defects above a size of 0.3 μm being automatically detected and classified in said edge region of the semiconductor wafer during the check.

The edge region of the semiconductor wafer is influenced by further processing steps in addition to the edge polishing, in particular by edge grinding, etching, double side polishing, chemical mechanical polishing or by epitaxial deposition on the semiconductor wafer, i.e. both processing steps which serve to provide a semiconductor wafer having a rounded and etched edge in accordance with step (a) of the process according to the invention and processing steps which are only intended to take place after the edge polishing, namely during the further processing of the semiconductor wafer in accordance with step (e) of the process according to the invention.

It is preferable for a check of the edge region of the semiconductor wafer to be carried out after each of the process steps which influence the edge region of the semiconductor wafer. It is preferable for all the processed semiconductor wafers to be checked.

An inspection unit which is known from the prior art, preferably the apparatus which is known from DE 10352936 A1, is used in such a way that the edge region of the semiconductor wafer is automatically checked and automatic defect classification is performed. The inspection unit can detect defects above a size of 0.3 μm. If the check of the edge region of the semiconductor wafer detects defects, one of the preceding process steps is controlled with a view to producing a semiconductor wafer which is as far as possible devoid of defects. For this purpose, by way of example process parameters are adjusted or optimized.

It is preferable for a semiconductor wafer in whose edge region defects are detected to be reprocessed using optimized process parameters. If reworking is not possible, the semiconductor wafer is sorted out and removed.

By virtue of the fact that preferably all the semiconductor wafers are checked, defective semiconductor wafers are reprocessed or alternatively sorted out and removed, and the check of the edge region of the semiconductor wafers takes place after each of the process steps which influence the quality of the edge region, it is possible to ensure that all the semiconductor wafers produced using the process according to the invention do not have any defects of a size of 0.3 μm or above.

The check of the semiconductor wafers for defects is preferably carried out after the following process steps, as well as the edge polishing:

After edge grinding, the semiconductor wafers are preferably checked for grinding defects and defects originating from previous process steps.

After etching, the semiconductor wafers are preferably checked for etching defects.

After double side polishing, chemical mechanical polishing or after an epitaxy step, the semiconductor wafers are preferably checked for handling defects, spots, scratches, particles or inhomogeneities relating to roughness.

The text which follows provides a description of examples of some process steps with regard to the defects which occur in the edge region, the causes of these defects and possible measures which can be taken to combat such defects.

After double side polishing, a tangentially running scratch is detected on the edge of a semiconductor wafer by inspection. This scratch cannot be reworked, the semiconductor wafer is scrapped. Possible causes of edge scratches after double side polishing may be foreign bodies or entrained fragments of semiconductor material which have become lodged in a carrier of the polishing machine, or alternatively a worn carrier caused by the plastic coating having become run down or by partial detachment of the plastic coating of the carrier. Corrective measures can be taken by means of a process control, for example, consisting in stopping the polishing machine, checking the polishing parameters, cleaning the polishing machine or inspecting the carriers and replacing them if necessary.

After edge rounding, spalling at the edge of the semiconductor wafer is detected by inspection. One possible cause of spalling of this type may be a crack formed during sawing or removal of the semiconductor wafer from the single crystal, which during edge rounding has increased in size to cause spalling. Another possible cause may also lie in incorrect handling. Spalling of this nature constitutes a particularly critical defect on the semiconductor wafer, since there is a risk that, as a result of spalling not being detected, the semiconductor wafer will break during a subsequent machining step, for example during a double side polishing, thereby damaging the polishing machine, which can, in turn, lead to an entire batch of polished semiconductor wafers being scrapped.

If particles are detected at the edge of the semiconductor wafer, after double side polishing, these particles can be removed without problems by further cleaning.

If, after epitaxial coating of the semiconductor wafer, a stacking fault is detected at the edge of the epitaxially coated semiconductor wafer, reworking is not possible. The associated semiconductor wafer is scrapped. Possible causes of stacking faults are crystal defects or strains in the crystal lattice. Corrective measures during process control can consist in optimizing a single crystal pulling process.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for producing a semiconductor wafer, comprising the following process sequence: (a) providing a semiconductor wafer having a rounded and etched edge; (b) polishing the edge of the semiconductor wafer by moving the semiconductor wafer which is held on a centrally rotating chuck and projects beyond the chuck toward at least one polishing drum which is inclined at an angle with respect to the chuck as rotates centrally and is covered with a polishing cloth and pressed against one another under a contact pressure, with a polishing abrasive being supplied continuously, the polishing drum and semiconductor wafer being moved away from one another after a predetermined number of revolutions of the semiconductor wafer; (c) cleaning the semiconductor wafer; (d) inspecting an edge region of the semiconductor wafer using an inspection unit; and (e) further processing the semiconductor wafer;

wherein the inspection of the edge region of the semiconductor wafer as described in step (d) automatically detects and classifies all the defects above a size of 0.3 μm in the edge region, and wherein, if defects are detected during the inspection, the semiconductor wafer is reprocessed as described in steps (b) to (d) and is then processed further as described in step (e), the edge polishing as described in step (b) being carried out with polishing parameters which have been optimized on the basis of the classification of the defects, or otherwise the semiconductor wafer is sorted out and removed if reprocessing is not possible on account of the defects which have been detected.

2. The process as claimed in claim 1, wherein the edge region of the semiconductor wafer comprises an edge of the semiconductor wafer as well as a peripheral region of 3 mm on the front and back surfaces of the semiconductor wafer.

3. The process of claim 1, wherein during the polishing of the edge of the semiconductor wafer, a chuck rotation time is 50 to 150 s, a rotational speed of the polishing drum is 500 to 1000 $min^{-1}$, a setting angle between polishing drum and semiconductor wafer is 30 to 50°, a flow of polishing abrasive is 0.15 to 0.40 liter/min and a contact pressure is 2 to 4 kg, and the semiconductor wafer and polishing drum are moved away from one another after 2 to 8 revolutions of the semiconductor wafer.

4. The process of claim 1, wherein the cleaning of the semiconductor wafer in step (c) is carried out in a sequence comprising cleaning with aqueous hydrochloric acid (HF), rinsing with ultra pure water, cleaning with $TMAH/H_2O_2$, rinsing with ultra pure water, and drying the semiconductor wafer.

5. The process of claim 1, wherein the further processing as described in step (e) comprises one or more of the process steps of: polishing the front surface of the semiconductor wafer, back surface sealing, depositing an epitaxial layer on the front surface of the semiconductor wafer, or heat treating the semiconductor wafer under a hydrogen or argon atmosphere.

6. The process of claim 1, wherein a plurality of edge region influencing process steps are applied to the semiconductor wafer, and wherein after each of these process steps, the edge region of the semiconductor wafer is checked using an inspection unit, the edge region of the semiconductor wafer comprising its edge and peripheral regions of its front and back surfaces at a distance of 3 mm from the edge, defects above a size of 0.3 μm being automatically detected and classified in said edge region of the semiconductor wafer during the check.

7. The process of claim 6, wherein the process steps which influence an edge region of the semiconductor wafer comprise edge grinding, double side polishing, an etching step and deposition of an epitaxial layer on the semiconductor wafer.

8. The process of claim 6, wherein the edge region of each processed semiconductor wafer is checked.

9. The process of claim 6, wherein following detection of defects the semiconductor wafer is reprocessed using optimized process parameters or, if rework is not possible on account of the detected defects, this semiconductor wafer is sorted out and removed.

10. The process of claim 6, wherein following detection of defects one of the preceding process steps is controlled by optimization of process parameters.

* * * * *